(12) United States Patent
Kai et al.

(10) Patent No.: US 10,699,994 B2
(45) Date of Patent: Jun. 30, 2020

(54) SEMICONDUCTOR DEVICE HAVING BONDING REGIONS EXPOSED THROUGH PROTECTIVE FILMS PROVIDED ON CIRCUIT PATTERNS ONTO WHICH COMPONENTS ARE SOLDERED

(71) Applicant: FUJI ELECTRIC CO., LTD., Kawasaki-shi, Kanagawa (JP)

(72) Inventors: Kenshi Kai, Matsumoto (JP); Rikihiro Maruyama, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/909,963

(22) Filed: Mar. 1, 2018

(65) Prior Publication Data
US 2019/0006272 A1    Jan. 3, 2019

(30) Foreign Application Priority Data

Jun. 30, 2017 (JP) .................................. 2017-129041

(51) Int. Cl.
*H01L 23/373* (2006.01)
*H01L 23/498* (2006.01)
(Continued)

(52) U.S. Cl.
CPC .... *H01L 23/49827* (2013.01); *H01L 23/3735* (2013.01); *H01L 23/49811* (2013.01); *H01L 24/05* (2013.01); *H05K 3/243* (2013.01); *H05K 3/3426* (2013.01); *H05K 3/4015* (2013.01); *H01L 23/053* (2013.01); *H01L 24/06* (2013.01); *H01L 24/29* (2013.01); *H01L 24/32* (2013.01); *H01L 24/45* (2013.01); *H01L 24/48* (2013.01); *H01L 24/73* (2013.01); *H01L 25/072* (2013.01); *H01L 2224/05553* (2013.01); *H01L 2224/0603* (2013.01); *H01L 2224/26175* (2013.01); *H01L 2224/29111* (2013.01); *H01L 2224/32225* (2013.01); *H01L 2224/45124* (2013.01);
(Continued)

(58) Field of Classification Search
CPC . H01L 2924/13091; H01L 2924/13055; H01L 2224/83801; H01L 24/73; H01L 2924/19105; H01L 2224/48137; H01L 2224/26175; H01L 2224/32225; H01L 2224/48091; H01L 2224/48227; H01L 2224/73265; H01L 2924/1301; H01L 2924/1305; H01L 2224/06181; H01L 23/3675; H01L 23/3735; H01L 24/06; H01L 2924/14; H01L 2924/014
See application file for complete search history.

(56) References Cited

U.S. PATENT DOCUMENTS

2007/0246833 A1* 10/2007 Soga ..................... H01L 23/24
257/772
2009/0194884 A1    8/2009 Stolze
(Continued)

*Primary Examiner* — Nelson Garces
(74) *Attorney, Agent, or Firm* — Rabin & Berdo, P.C.

(57) ABSTRACT

In a semiconductor device, protective films are formed on facing side surfaces of a plurality of circuit patterns and a plating process or the like is not performed on parts aside from the side surfaces where the protective films are formed. This means that when semiconductor elements and contact elements are directly bonded via solder onto the plurality of circuit patterns, a drop-in wettability of the plurality of circuit patterns for the solder is avoided.

18 Claims, 9 Drawing Sheets

(51) Int. Cl.
   *H01L 23/00*   (2006.01)
   *H05K 3/34*    (2006.01)
   *H05K 3/24*    (2006.01)
   *H05K 3/40*    (2006.01)
   *H01L 25/07*       (2006.01)
   *H01L 23/053*      (2006.01)

(52) U.S. Cl.
   CPC ........... *H01L 2224/45144* (2013.01); *H01L 2224/48091* (2013.01); *H01L 2224/48137* (2013.01); *H01L 2224/48227* (2013.01); *H01L 2224/48472* (2013.01); *H01L 2224/73265* (2013.01); *H01L 2224/83801* (2013.01); *H01L 2224/85447* (2013.01); *H01L 2924/00014* (2013.01); *H01L 2924/014* (2013.01); *H01L 2924/13055* (2013.01); *H01L 2924/13091* (2013.01); *H01L 2924/14* (2013.01); *H01L 2924/19105* (2013.01); *H01L 2924/19107* (2013.01); *H05K 3/4007* (2013.01); *H05K 2201/10318* (2013.01); *H05K 2203/072* (2013.01)

(56) References Cited

U.S. PATENT DOCUMENTS

| | | | |
|---|---|---|---|
| 2010/0308465 A1* | 12/2010 | Ogura | H01L 23/3735 257/772 |
| 2017/0025344 A1* | 1/2017 | Kanai | H01L 23/49894 |
| 2018/0090412 A1* | 3/2018 | Ikeda | H01L 23/15 |
| 2018/0190568 A1* | 7/2018 | Naba | H01L 25/0655 |

\* cited by examiner

FIG. 9 ns particularly pointed out in the claims.

SEMICONDUCTOR DEVICE HAVING BONDING REGIONS EXPOSED THROUGH PROTECTIVE FILMS PROVIDED ON CIRCUIT PATTERNS ONTO WHICH COMPONENTS ARE SOLDERED

CROSS-REFERENCE TO RELATED APPLICATION

This application is based upon and claims the benefit of priority of the prior Japanese Patent Application No. 2017-129041, filed on Jun. 30, 2017, the entire contents of which are incorporated herein by reference.

BACKGROUND OF THE INVENTION

1. Field of the Invention

The embodiments discussed herein are related to a semiconductor device.

2. Background of the Related Art

Semiconductor devices include semiconductor elements such as IGBT (Insulated Gate Bipolar Transistors) and power MOSFET (Metal Oxide Semiconductor Field Effect Transistors). These semiconductor devices are used as power converting devices, for example.

A semiconductor device includes a substrate with an insulating plate and a plurality of circuit patterns formed on a front surface of the insulating plate. Semiconductor elements and external connection terminals are disposed on the circuit patterns and signals applied from the external connection terminals are inputted into the semiconductor elements via the circuit patterns.

Cylindrical contact elements are used when attaching the external connection terminals to the circuit patterns. The external connection terminals are press-fitted into contact elements that have been bonded to the circuit patterns using solder, thereby electrically connecting the external connection terminals to the circuit patterns via the contact elements. See, for example, U.S. Patent Application Publication No. 2009/0194884.

With the semiconductor device described above, a plating process using nickel or the like is performed on the surfaces of the circuit patterns. This suppresses corrosion of the circuit patterns, which prevents substances produced by corrosion (hereinafter referred to as "corrosion products") from causing short circuits between the circuit patterns.

However, circuit patterns that have been subjected to a plating process are less wettable for solder, which makes it difficult to avoid the production of voids inside the solder. This means that when components such as cylindrical contact elements and semiconductor elements are bonded via solder to circuit patterns that have been plated, it is not possible to achieve sufficient bonding strength for the components on the circuit patterns.

SUMMARY OF THE INVENTION

In one aspect of the embodiments, there is provided a semiconductor device including: a substrate including an insulating plate and a plurality of circuit patterns formed on a front surface of the insulating plate; a plurality of protective films formed on at least facing side portions of the plurality of circuit patterns so as to expose bonding regions on front surfaces of the plurality of circuit patterns; and a plurality of components bonded via solder onto the bonding regions of the plurality of circuit patterns.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings, wherein like reference numerals refer to like elements throughout.

First Embodiment

A semiconductor device according to a first embodiment will now be described with reference to FIGS. 1 to 3.

Figure 1:
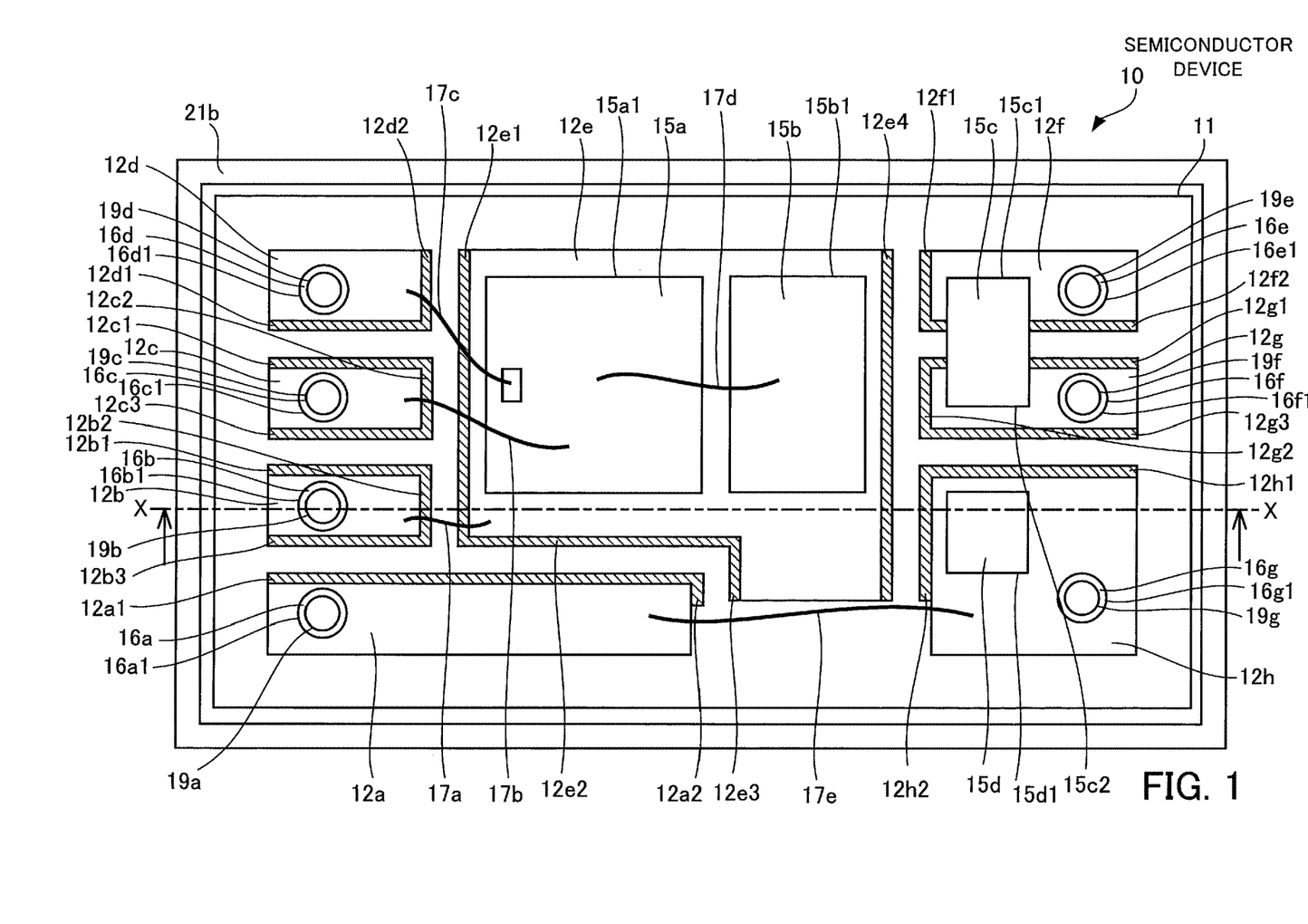
FIG. 1 is a plan view of a semiconductor device according to a first embodiment.

FIG. 1 is a plan view of a semiconductor device according to the first embodiment. FIG. 2 is a cross-sectional view of the semiconductor device according to the first embodiment. FIG. 3 is a plan view of the semiconductor device according to the first embodiment, in which components have been omitted.

Figure 2:
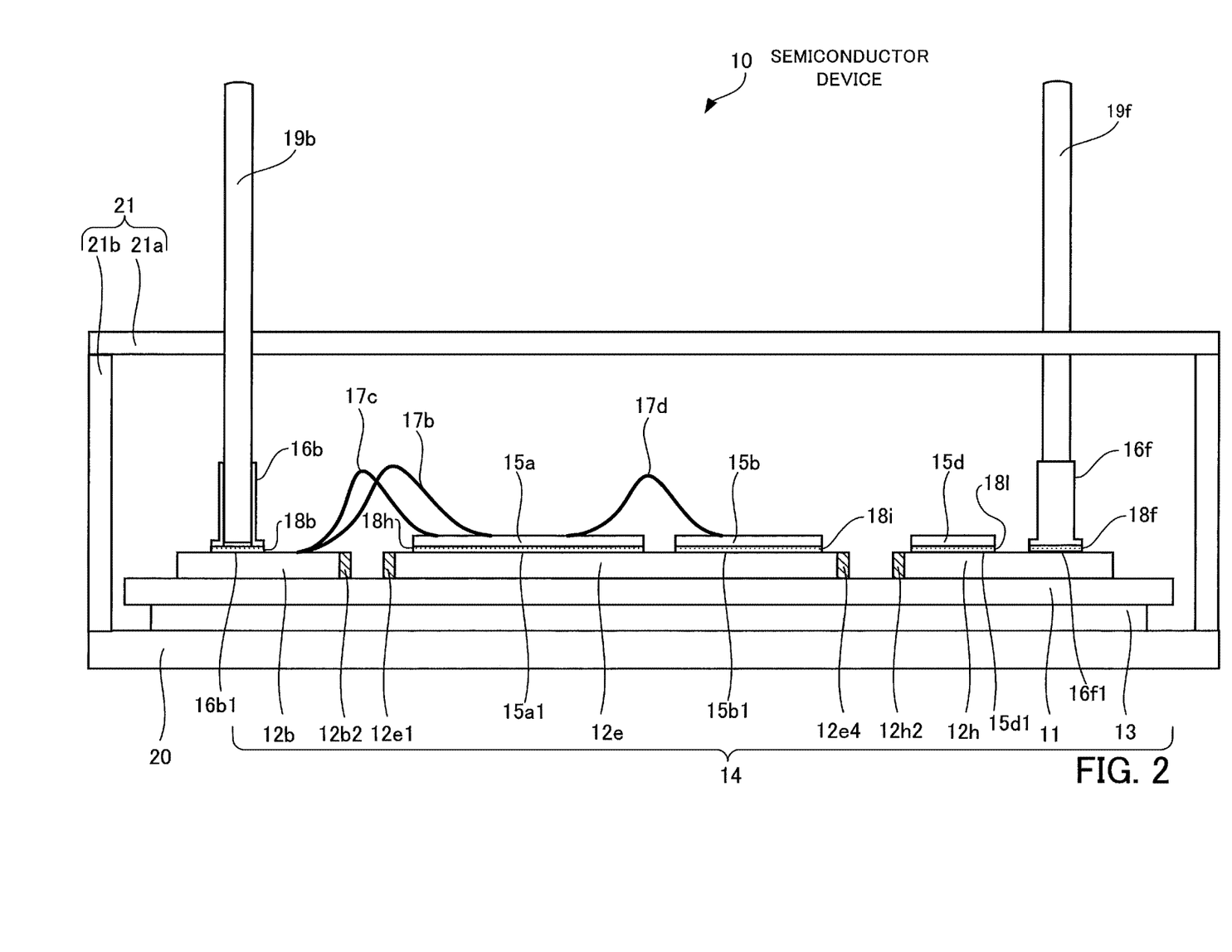
FIG. 2 is a cross-sectional view of the semiconductor device according to the first embodiment.
Figure 3:
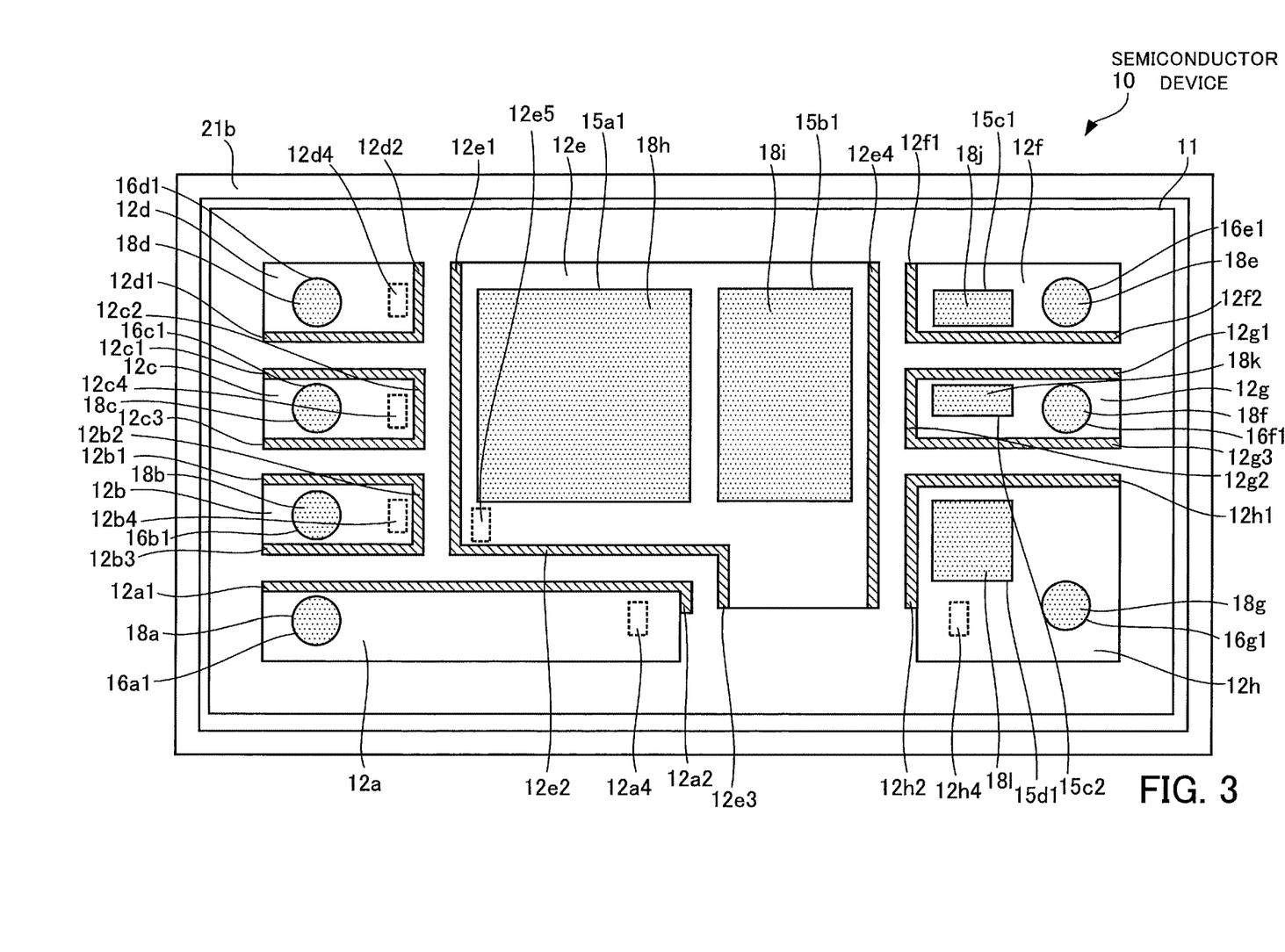
FIG. 3 is a plan view of the semiconductor device according to the first embodiment, in which components have been omitted.

Note that in FIG. 1 and FIG. 3, a cover portion 21a of a case 21 and a metal substrate 20 have been omitted from the drawings. FIG. 2 is a cross-sectional view along a dot-dash line X-X in FIG. 1. Note also that the components depicted in FIG. 1, that is, semiconductor elements 15a, 15b, and 15d, an electronic component 15c, contact elements 16a to 16g, and bonding wires 17a to 17e are omitted from FIG. 3.

As depicted in FIGS. 1 and 2, a semiconductor device 10 has a ceramic circuit substrate 14 (or simply "substrate"), the semiconductor elements 15a, 15b, and 15d, the electronic component 15c, and the contact elements 16a to 16g that are bonded to a front surface of the ceramic circuit substrate 14, and external connection terminals 19a to 19g that are respectively attached to the contact elements 16a to 16g. Note that the numbers and bonding positions of the semiconductor elements 15a, 15b, and 15d, the electronic component 15c, and the contact elements 16a to 16g that are bonded onto the ceramic circuit substrate 14 (i.e., onto circuit patterns 12a to 12h, described later) are mere examples. So long as the semiconductor elements 15a, 15b, and 15d, the electronic component 15c, and the contact elements 16a to 16g are on the ceramic circuit substrate 14 (i.e., on the circuit patterns 12a to 12h), configurations aside from that depicted in FIGS. 1 and 2 may be used.

In addition, the semiconductor device 10 has the metal substrate 20, on which the ceramic circuit substrate 14 is disposed, and the case 21, which is provided on the metal substrate 20, which covers the ceramic circuit substrate 14, and from which the external connection terminals 19a to 19g extend.

The ceramic circuit substrate 14 has an insulating plate 11, the circuit patterns 12a to 12h that are formed on the front surface of the insulating plate 11, and a metal plate 13 formed on a rear surface of the insulating plate 11.

The circuit patterns 12a to 12h are formed of a material with superior electrical conductivity and superior wetting for the solder. Examples of this type of material are silver, copper, and alloys that include at least one of these metals. As depicted in FIG. 1, these circuit patterns 12a to 12h are respectively formed in predetermined shapes. Note that the number, shapes, and formed positions on the insulating plate 11 of the circuit patterns 12a to 12h are mere examples, and may differ from the example in FIGS. 1 and 2.

First protective films 12a1, 12a2, 12b1 to 12b3, 12c1 to 12c3, 12d1, 12d2, 12e1 to 12e4, 12f1, 12f2, 12g1 to 12g3, 12h1, and 12h2 are formed on facing side surfaces of the circuit patterns 12a to 12h.

More specifically, the first protective films 12a1 and 12a2 are formed on side surfaces of the circuit pattern 12a that face the circuit patterns 12b and 12e. The first protective films 12b1 to 12b3 are formed on side surfaces of the circuit pattern 12b that face the circuit patterns 12c, 12e, and 12a. The first protective films 12c1 to 12c3 are formed on side surfaces of the circuit pattern 12c that face the circuit patterns 12d, 12e, and 12b. The first protective films 12d1 and 12d2 are formed on side surfaces of the circuit pattern 12d that face the circuit patterns 12c and 12e.

The first protective films 12e1 to 12e3 are formed on side surfaces of the circuit pattern 12e that face the circuit patterns 12d, 12c, 12b, and 12a. In addition, the first protective film 12e4 is formed on the circuit pattern 12e on a side surface that faces the circuit patterns 12f to 12h.

The first protective films 12f1 and 12f2 are formed on side surfaces of the circuit pattern 12f that face the circuit patterns 12e and 12g. The first protective films 12g1 to 12g3 are formed on side surfaces of the circuit pattern 12g that face the circuit patterns 12f, 12e, and 12h. The first protective films 12h1 and 12h2 are formed on side surfaces of the circuit pattern 12h that face the circuit patterns 12g and 12e.

Note that in the following description, when no specific distinction is made between the first protective films, the reference numerals 12a1, 12a2, 12b1 to 12b3, 12c1 to 12c3, 12d1, 12d2, 12e1 to 12e4, 12f1, 12f2, 12g1 to 12g3, 12h1, and 12h2 may be omitted.

The first protective films use a material with superior resistance to corrosion. Example materials include aluminum, nickel, titanium, chromium, molybdenum, tantalum, niobium, tungsten, vanadium, bismuth, zirconium, hafnium, gold, platinum, palladium, and alloys that include at least one of these metals.

It is possible to form the first protective films described above on the side surfaces of the circuit patterns 12a to 12h by electroless plating, for example. When doing so, by forming a mask (resist) in advance in regions of the circuit patterns 12a to 12h where the first protective films are not to be formed and removing the resist after electroless plating, it is possible to form the first protective films on only the desired side surfaces of the circuit patterns 12a to 12h.

Accordingly, the first protective films described above are formed on only facing side surfaces of the circuit patterns 12a to 12h and a plating process is not performed (i.e., plating films are not formed) on regions aside from the side surfaces where the first protective films are formed.

As examples of the ceramic circuit substrate 14 with the configuration described above, it is possible to use a DCB (Direct Copper Bonding) substrate or an AMB (Active Metal Blazed) substrate. The ceramic circuit substrate 14 is capable of conducting heat produced by the semiconductor elements 15a, 15b, and 15d and the electronic component 15c via the circuit patterns 12e to 12h, the insulating plate 11, and the metal plate 13, to the metal substrate 20 side.

The metal plate 13 is formed of a metal material with superior thermal conductivity, such as aluminum, iron, silver, copper or an alloy that includes at least one of these metals.

The insulating plate 11 is formed of a ceramic material with high thermal conductivity, such as aluminum oxide, aluminum nitride, and silicon nitride. Note that as one example, the insulating plate 11 may be rectangular when viewed from above. The metal plate 13 is also formed as a rectangle with a smaller area than the insulating plate 11 when viewed from above.

As one example, the semiconductor elements 15a, 15b, and 15d include switching elements such as IGBT or power MOSFETs. As an example configuration, the semiconductor elements 15a, 15b, and 15d are respectively equipped with drain electrodes (or "collector electrodes") as main electrodes on their rear surfaces and gate electrodes and source electrodes (or "emitter electrodes") as main electrodes on their front surfaces.

As appropriate, the semiconductor elements 15a, 15b, and 15d also include diodes such as SBD (Schottky Barrier Diodes) and FWD (Free Wheeling Diodes). The semiconductor elements 15a, 15b, and 15d in this case are respectively equipped with cathode electrodes as main electrodes on their rear surfaces and anode electrodes as main electrodes on their front surfaces. The semiconductor elements 15a, 15b, and 15d described above have their rear surfaces bonded to predetermined circuit patterns 12e to 12h.

As the semiconductor elements 15a, 15b, and 15d, it is possible to use silicon semiconductor elements and widebandgap semiconductor elements, such as silicon carbide.

Note that the semiconductor elements 15a and 15b are bonded via solder 18h and 18i onto bonding regions 15a1 and 15b1 of the circuit pattern 12e. In addition, the semiconductor element 15d is bonded via solder 18l onto a bonding region 15d1 of the circuit pattern 12h.

As examples, the electronic component 15c is a resistor, a thermistor, a capacitor, or a surge absorber. The electronic component 15c spans between the circuit patterns 12f and 12g and is bonded via solder 18j and 18k onto bonding regions 15c1 and 15c2 of the circuit patterns 12f and 12g.

As described earlier and depicted in FIGS. 1 and 3, a plating process or the like is not performed on the circuit patterns 12a to 12h aside from the side surfaces where the first protective films are formed. This means that the solder 18h to 18l is directly applied onto the bonding regions of the circuit patterns 12e to 12h for the semiconductor elements 15a, 15b, and 15d and the electronic component 15c, thereby avoiding a drop in the wettability of the circuit patterns 12e to 12h for the solder 18h to 18l. Accordingly, a drop in the bonding strength of the semiconductor elements 15a, 15b, and 15d and the electronic component 15c on the circuit patterns 12e to 12h is avoided.

For a configuration where the plating process is performed on the bonding regions 15a1, 15b1, and 15d1 of the circuit patterns 12e and 12h for the semiconductor elements 15a, 15b, and 15d, there is a drop-in wettability of the circuit patterns 12e and 12h for the solder 18h, 18i, and 18l. This results in voids remaining in the bonds between the semiconductor elements 15a, 15b, and 15d and the circuit patterns 12e and 12h, which causes a drop in the bonding strength of the semiconductor elements 15a, 15b, and 15d. Thermal resistance between the semiconductor elements 15a, 15b, and 15d and the metal substrate 20 also increases, which reduces the dissipation of heat.

For a configuration where a plating process is performed on the bonding regions 15c1 and 15c2 of the circuit patterns 12f and 12g for the electronic component 15c, there is a drop-in wettability of the circuit patterns 12f and 12g for the solder 18j and 18k. This causes the solder 18j and 18k to creep up an electrode surface of the electronic component 15c. Accordingly, there is a drop in the amount of the solder 18j and 18k formed between the circuit patterns 12f and 12g and the electronic component 15c, resulting in a drop in the bonding strength of the electronic component 15c.

The contact elements 16a to 16g have cylindrical shapes where internal voids are formed between open ends. One open end of each of the contact elements 16a to 16g is bonded via solder 18a to 18g onto bonding regions 16a1 to 16g1 of the circuit patterns 12a to 12d and 12f to 12h. The external connection terminals 19a to 19g are respectively press fitted into the other open ends of the contact elements 16a to 16g. In this way, the contact elements 16a to 16g are respectively bonded to the circuit patterns 12a to 12d and 12f to 12h using the solder 18a to 18g. Note that out of the contact elements 16a to 16g, FIG. 2 depicts the contact elements 16b and 16f bonded onto the circuit patterns 12b and 12h. The contact elements 16a to 16g are formed of a metal with superior electrical conductivity, such as aluminum, iron, silver, copper or an alloy that includes at least one of these metals. Also, to increase resistance to corrosion, it is possible to form a plating film on the surface of the contact elements 16a to 16g by a plating process using a metal, such as nickel or gold. Aside from nickel and gold, specific materials for a plating film include a nickel-phosphorus alloy and a nickel-boron alloy.

The external connection terminals 19a to 19g are formed of a metal with superior electrical conductivity, such as aluminum, iron, silver, copper or an alloy that includes at least one of these metals. The external connection terminals 19a to 19g are rod shaped and as one example are square in cross section. The external connection terminals 19a to 19g are respectively press-fitted into the internal voids of the contact elements 16a to 16g, so that the external connection terminals 19a to 19g are electrically connected via the contact elements 16a to 16g to the circuit patterns 12a to 12d and 12f to 12h.

As depicted in FIGS. 1 and 3 and described earlier, parts of the circuit patterns 12a to 12h aside from the side surfaces where the first protective films are formed are not subjected to a plating process or the like. This means that the solder 18a to 18g is directly applied to the bonding regions for the contact elements 16a to 16g on the circuit patterns 12a to 12d and 12f to 12h, thereby avoiding a drop in the wettability of the circuit patterns 12a to 12d and 12f to 12h for the solder 18a to 18g. Accordingly, a drop in the bonding strength of the contact elements 16a to 16g onto the circuit patterns 12a to 12d and 12f to 12h is avoided, and it is possible to reliably and stably press fit the external connection terminals 19a to 19g into the contact elements 16a to 16g.

For a configuration where a plating process is performed on the bonding regions for the contact elements 16a to 16g on the circuit patterns 12a to 12d and 12f to 12h, there is a drop in the wettability of the circuit patterns 12a to 12d and 12f to 12h for the solder 18a to 18g. When the contact elements 16a to 16g are bonded via the solder 18a to 18g onto the circuit patterns 12a to 12d and 12f to 12h, the solder 18a to 18g creeps up inside the contact elements 16a to 16g. This causes a reduction in the amount of solder 18a to 18g formed between the circuit patterns 12a to 12d and 12f to 12h and the contact elements 16a to 16g, which results in a drop in the bonding strength of the contact elements 16a to 16g. It also becomes difficult to press fit the external connection terminals 19a to 19g into the contact elements 16a to 16g. Alternatively, there is the risk of the contact elements 16a to 16g becoming bent when the external connection terminals 19a to 19g are press-fitted into the contact elements 16a to 16g.

Since a plating process or the like is not performed on the bonding regions for the semiconductor elements 15a, 15b, and 15d, the electronic component 15c, and the contact elements 16a to 16g on the circuit patterns 12a to 12h, a drop in the wettability of the circuit patterns 12a to 12h for the solder 18a to 18g is avoided. Accordingly, a drop in the bonding strength for the semiconductor elements 15a, 15b, and 15d, the electronic component 15c, and the contact elements 16a to 16g onto the circuit patterns 12a to 12h is avoided.

The solder 18a to 18l is formed of lead-free solder that has at least one alloy out of a tin-silver-copper alloy, a tin-zinc-bismuth alloy, a tin-copper alloy, and a tin-silver-indium-bismuth alloy as a main component. In addition to this main component, the solder 18a to 18l may include additives such as nickel, germanium, cobalt or silicon.

Note that on the ceramic circuit substrate 14, the circuit patterns 12a to 12h may be connected as appropriate by bonding wires 17a to 17e. More specifically, as depicted in FIGS. 1 and 3, a bonding region 12b4 of the circuit pattern 12b and a bonding region 12e5 of the circuit pattern 12e are electrically connected by the bonding wire 17a. A bonding region 12c4 of the circuit pattern 12c and (the source electrode of) the semiconductor element 15a are electrically connected by the bonding wire 17b and a bonding region 12d4 of the circuit pattern 12d and (the gate electrode of) the semiconductor element 15a are electrically connected by the bonding wire 17c. In addition, the semiconductor elements 15a and 15b are electrically connected by the bonding wire 17d and a bonding region 12a4 of the circuit pattern 12a and a bonding region 12h4 of the circuit pattern 12h are electrically connected by the bonding wire 17e.

Note that the bonding of the bonding wires 17a to 17e to the bonding regions 12a4, 12b4, 12c4, 12d4, 12e5, and 12h4 onto the circuit patterns 12a to 12e and 12h is performed by ultrasonic bonding, for example. The bonding wires 17a to 17e are formed of a metal with superior electrical conductivity, such as aluminum, copper, gold, or an alloy that includes at least one of these metals.

As depicted in FIGS. 1 and 3 and described earlier, parts of the circuit patterns 12a to 12h aside from the desired side surfaces are not subjected to a plating process or the like. Accordingly, it is possible to reliably bond the bonding wires 17a to 17e to the bonding regions 12a4, 12b4, 12c4, 12d4, 12*e*5, and 12*h*4 of the circuit patterns 12*a* to 12*e* and 12*h* with no drop in bonding strength.

In this semiconductor device 10, the circuit patterns 12*a* to 12*h* and the semiconductor elements 15*a*, 15*b*, and 15*d* are connected as appropriate by the bonding wires 17*a* to 17*e*. In addition, by electrically connecting the external connection terminals 19*a* to 19*g* to the circuit patterns 12*a* to 12*d* and 12*f* to 12*h*, a predetermined circuit that includes the semiconductor elements 15*a*, 15*b*, and 15*d* and the electronic component 15*c* is constructed.

The metal substrate 20 is formed of a metal with superior thermal conductivity, such as aluminum, iron, silver, copper or an alloy that includes at least one of these metals. Also, to improve the resistance to corrosion, it is possible to perform a plating process or the like to provide a material such as nickel on the surface of the metal substrate 20. As specific examples, a nickel-phosphorus alloy or a nickel-boron alloy may be used instead of nickel.

Note that it is also possible to improve heat dissipation by providing a cooler (not illustrated) on a rear surface of the metal substrate 20 by bonding via solder, silver solder, or the like or by mechanical attachment with thermal paste or the like in between. The cooler referred to here is formed of a metal with superior thermal conductivity, such as aluminum, iron, silver, copper or an alloy that includes at least one of these metals. As the cooler, it is possible to use a fin, a heat sink with a plurality of fins, a cooling device that uses water cooling, or another. It is also possible to use a configuration where the metal substrate 20 is integrally formed with the cooler. This configuration is formed of a metal with superior thermal conductivity, such as aluminum, iron, silver, copper or an alloy that includes at least one of these metals. To improve the resistance to corrosion, it is also possible to perform a plating process or the like to provide a material such as nickel on the surface of the metal substrate 20 that is integrated with the cooler. As specific examples, a nickel-phosphorus alloy or a nickel-boron alloy may be used instead of nickel.

The case 21 is formed in a box shape and has the cover portion 21*a* that covers the ceramic circuit substrate 14 from above and a side wall portion 21*b* that is provided on the outer circumference of the ceramic circuit substrate 14 and covers side portions of the ceramic circuit substrate 14. The case 21 is formed of a thermoplastic resin. As the resin, it is possible to use polyphenylene sulfide (PPS), polybutylene terephthalate (PBT) resin, polybutylene succinate (PBS) resin, polyamide (PA) resin, acrylonitrile butadiene styrene (ABS) resin, or the like.

The side wall portion 21*b* of the case 21 is bonded to the metal substrate 20 via adhesive (not illustrated). Note that the adhesive may be applied to a base portion of the side wall portion 21*b* of the case 21 or onto a region of the metal substrate 20 where the case 21 is mounted. As the method of applying the adhesive, it is possible to use any known method in the art, such as screen printing using a mask or a dispensing method that uses a syringe.

It is also possible to seal the inside of the case 21 using a sealant (not illustrated). As one example, the sealant is formed of a thermosetting resin, such as maleimide-modified epoxy resin, maleimide-modified phenol resin, and maleimide resin. The sealant may also be formed of a gel. The sealant is injected into the case 21 from a predetermined injection hole formed in the case 21. The sealant injected into the case 21 seals the ceramic circuit substrate 14, the semiconductor elements 15*a*, 15*b*, and 15*d*, the electronic component 15*c*, the contact elements 16*a* to 16*g*, the bonding wires 17*a* to 17*e*, and parts of the external connection terminals 19*a* to 19*g* on the metal substrate 20.

As described earlier, parts of the circuit patterns 12*a* to 12*h* aside from the side surfaces where the first protective film is formed are not subjected to a plating process or the like. This improves the adhesive force of the sealant on the circuit patterns 12*a* to 12*h*. Accordingly, it is possible to appropriately seal the ceramic circuit substrate 14, the semiconductor elements 15*a*, 15*b*, and 15*d*, the electronic component 15*c* and the like inside the case 21 with the sealant.

This completes the description of the configuration of the semiconductor device 10.

With the semiconductor device 10, input signals are applied from outside to the external connection terminals 19*a* to 19*g* and output signals are outputted. With a configuration where the first protective films are not formed on the side surfaces of the circuit patterns 12*a* to 12*h*, short circuits may occur between the circuit patterns due to corrosion products. More specifically, due to electrical fields and the like produced between facing side surfaces of the circuit patterns 12*a* to 12*h*, the copper of the circuit patterns 12*a* to 12*h* becomes ionized so that products of copper corrosion are produced between the circuit patterns 12*a* to 12*h* (a phenomenon called "ion migration"). When corrosion products are produced between adjacent circuit patterns, short circuits occur between the adjacent circuit patterns.

With the semiconductor device 10 however, out of the circuit patterns 12*a* to 12*h*, the first protective films are formed on facing side surfaces of the circuit patterns 12*a* to 12*h*. This prevents corrosion products from being produced by ion migration on facing side surfaces of adjacent circuit patterns out of the circuit patterns 12*a* to 12*h*. By doing so, it is possible to avoid short circuits between adjacent circuit patterns.

The semiconductor device 10 described above has the ceramic circuit substrate 14 that includes the insulating plate 11 and the plurality of circuit patterns 12*a* to 12*h* formed on the front surface of the insulating plate 11. The semiconductor device 10 includes the semiconductor elements 15*a*, 15*b*, and 15*d*, the electronic component 15*c*, the contact elements 16*a* to 16*g* that are disposed via the solder 18*a* to 18*i* on the bonding regions 15*a*1, 15*b*1, 15*d*1, 15*c*1, 15*c*2, and 16*a*1 to 16*g*1 on the front surfaces of the plurality of circuit patterns 12*a* to 12*h*, and also the bonding wires 17*a* to 17*e*. In addition, the semiconductor device 10 includes a plurality of first protective films formed on facing side surfaces of the plurality of circuit patterns 12*a* to 12*h*.

In the semiconductor device 10, the plurality of first protective films are formed on the facing side surfaces of the plurality of circuit patterns 12*a* to 12*h* and a plating process or the like is not performed on parts aside from the side surfaces.

This means that when the semiconductor elements 15*a*, 15*b*, and 15*d*, the electronic component 15*c*, and the contact elements 16*a* to 16*g* are directly bonded via the solder 18*a* to 18*i* onto the bonding regions 15*a*1, 15*b*1, 15*d*1, 15*c*1, 15*c*2, and 16*a*1 to 16*g*1 of the plurality of circuit patterns 12*a* to 12*h*, a drop in the wettability of the circuit patterns 12*a* to 12*h* for the solder 18*a* to 18*i* is avoided. Accordingly, a drop in the bonding strength of the semiconductor elements 15*a*, 15*b*, and 15*d*, the electronic component 15*c*, and the contact elements 16*a* to 16*g* on the plurality of circuit patterns 12*a* to 12*h* is avoided.

In addition, since the first protective films are formed on the facing side surfaces of the adjacent circuit patterns out of the plurality of circuit patterns 12a to 12h, the production of corrosion products by ion migration on the facing side surfaces of adjacent circuit patterns is avoided. By doing so, it is possible to avoid short circuits between adjacent circuit patterns.

Accordingly, there is a reduction in malfunctions of the semiconductor device 10, which improves reliability.

Note that in the above description, the semiconductor elements 15a, 15b, and 15d, the electronic component 15c, the contact elements 16a to 16g, and the bonding wires 17a to 17e are included as components of the semiconductor device 10. However, the expression "components" is not limited to these, and it is also possible to include any components that are bonded onto the circuit patterns 12a to 12h via solder, such as a lead frame.

As one example, the circuit patterns 12a to 12h of the ceramic circuit substrate 14 of the semiconductor device 10 are obtained by forming a copper foil on the insulating plate 11 and etching the copper foil into predetermined patterns. For the first embodiment described above, the side surfaces of the circuit patterns 12a to 12h are formed by etching so as to be perpendicular to the front surface of the insulating plate 11. However, depending on the state of the etching and the copper foil or the like on the insulating plate 11, there are cases where side surfaces of the circuit patterns 12a to 12h are not perpendicular to the front surface of the insulating plate 11 as described above. As examples of this situation, the circuit patterns 12e and 12h are described below with reference to FIG. 4.

Figure 4:
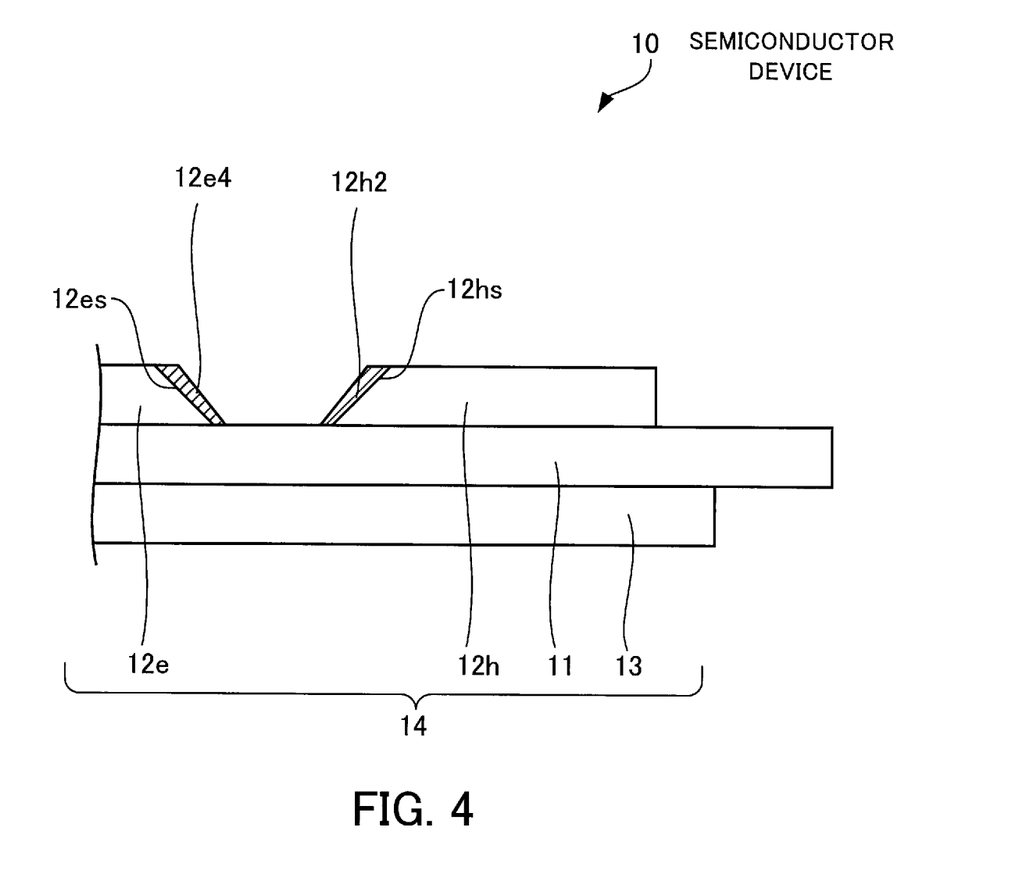
FIG. 4 depicts circuit patterns on a substrate of a semiconductor device that is a modification of the first embodiment.

FIG. 4 depicts circuit patterns on a substrate of a semiconductor device that is a modification of the first embodiment.

Note that the area depicted in FIG. 4 is an enlargement of a principal part of the cross section depicted in FIG. 2. The semiconductor elements 15a, 15b, and 15d, the electronic component 15c, and the contact elements 16a to 16g on the ceramic circuit substrate 14 and the bonding wires 17a to 17e are omitted from FIG. 4.

As depicted in FIG. 4, side surfaces 12es and 12hs of the circuit patterns 12e and 12h are formed by etching so as to be inclined and therefore not perpendicular to the front surface of the insulating plate 11.

Even when the side surfaces 12es and 12hs of the circuit patterns 12e and 12h are inclined in this way to the front surface of the insulating plate 11, in the same way as described above, the first protective films 12e4 and 12h2 are formed on the side surfaces 12es and 12hs. Likewise, first protective films are formed in the same way on side surfaces of the other circuit patterns 12a to 12d, 12f, and 12g that are omitted from the drawings, even when the side surfaces are inclined to the front surface of the insulating plate 11.

Even when the first protective films are formed in this way on inclined side surfaces, the same effects as the semiconductor device 10 described above are obtained.

Second Embodiment

In this second embodiment, a configuration where second protective films are formed in addition to the first protective films of the first embodiment will be described.

A semiconductor device 10a according to the second embodiment will now be described with reference to FIGS. 5 and 6.

Figure 5:
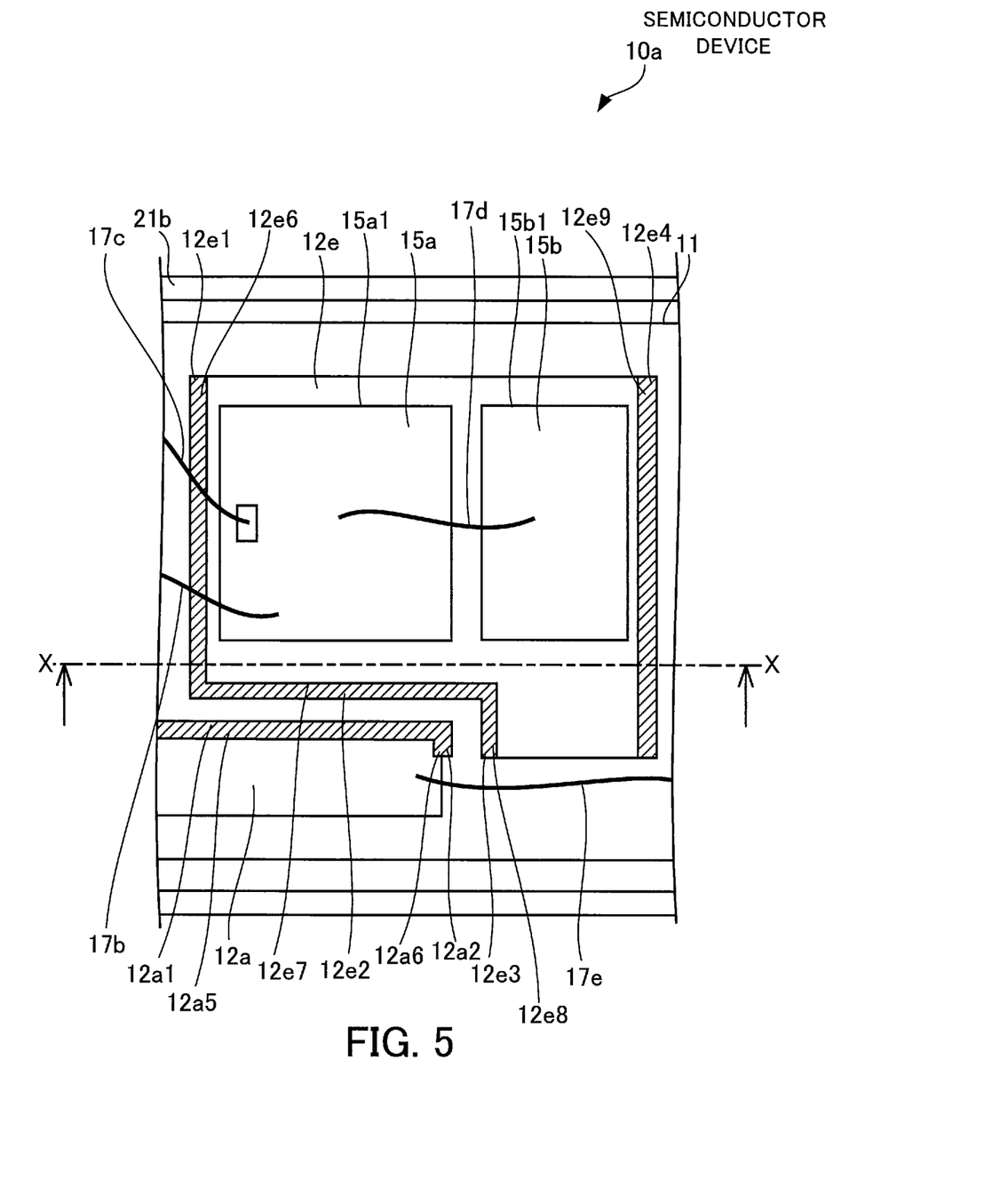
FIG. 5 is a plan view of a principal part of a semiconductor device according to a second embodiment.

FIG. 5 is a plan view of a principal part of the semiconductor device according to the second embodiment. FIG. 6 is a cross-sectional view of the principal part of the semiconductor device according to the second embodiment.

Figure 6:
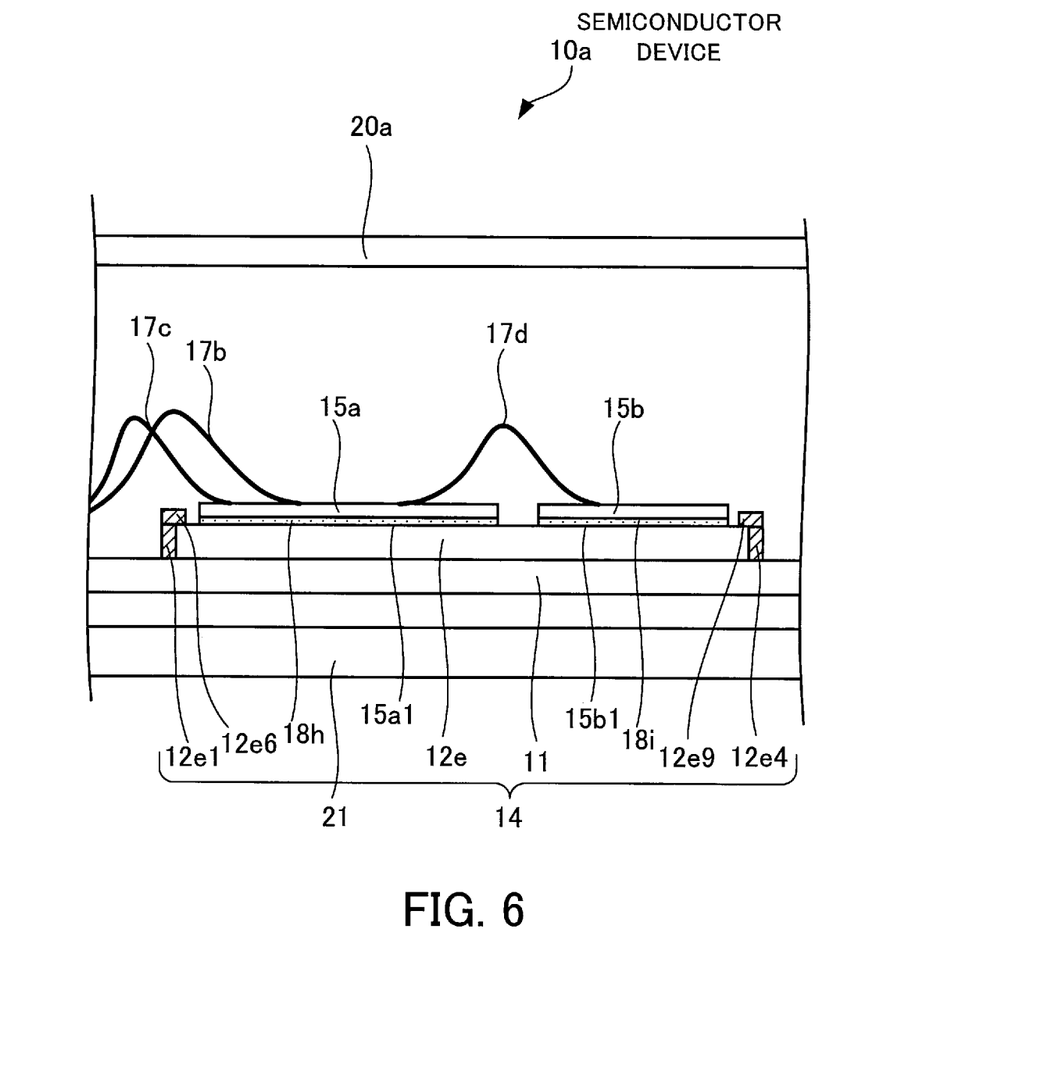
FIG. 6 is a cross-sectional view of a principal part of a semiconductor device according to the second embodiment.

Note that in the semiconductor device 10a depicted in FIGS. 5 and 6, parts with the same reference numerals as the semiconductor device 10 according to the first embodiment (depicted in FIGS. 1 to 3) indicate the same configurations.

FIG. 5 corresponds to a plan view of the periphery of the circuit pattern 12e in FIG. 1 of the first embodiment. FIG. 6 is a cross-sectional view along the dot-dash line X-X in FIG. 5.

In the same way as the semiconductor device 10, the semiconductor device 10a has the first protective film formed on facing side surfaces of the plurality of circuit patterns 12a to 12h. In addition, with the semiconductor device 10a, the second protective films are formed on edge portions of the front surfaces of the circuit patterns 12a to 12h along the first protective films formed on the side surfaces of the circuit patterns 12a to 12h.

As one example, as depicted in FIGS. 5 and 6, the circuit pattern 12e has a first protective film 12e1 formed on the side surface that faces the circuit patterns 12b to 12d (see FIG. 1) and has a second protective film 12e6 formed on an edge portion of the front surface of the circuit pattern 12e along the first protective film 12e1. The circuit pattern 12e has first protective films 12e2 and 12e3 formed on side surfaces that face the circuit pattern 12a (see FIG. 1) and has second protective films 12e7 and 12e8 formed on edge portions of the front surface of the circuit pattern 12e along the first protective films 12e2 and 12e3. In addition, the circuit pattern 12e has a first protective film 12e4 formed on a side surface that faces the circuit patterns 12f to 12h (see FIG. 1) and has the second protective film 12e9 formed on an edge portion of the front surface of the circuit pattern 12e along the first protective film 12e4.

Also, as depicted in FIG. 5, the circuit pattern 12a has first protective films 12a1 and 12a2 formed on the side surfaces that face the circuit patterns 12b and 12e (see FIG. 1) and has the second protective films 12a5 and 12a6 formed on edge portions of the front surface of the circuit pattern 12a along the first protective films 12a1 and 12a2. Note that when no specific distinction is made between the second protective films, the reference numerals 12a6, 12a7, and 12e6 to 12e9 may be omitted.

Although omitted from the drawings, first protective films are formed on facing side surfaces of the circuit patterns 12b to 12d and 12f to 12h in the same way as the circuit patterns 12a and 12e and second protective films (also not illustrated) are formed on edge portions of the front surfaces of the circuit patterns 12b to 12d and 12f to 12h along the first protective films.

In the same way as the first protective films, the second protective films use a material with superior resistance to corrosion. Example materials include aluminum, nickel, titanium, chromium, molybdenum, tantalum, niobium, tungsten, vanadium, bismuth, zirconium, hafnium, gold, platinum, palladium, and alloys that include at least one of these metals.

In the same way as the first protective films in the first embodiment, it is possible to form the second protective films by electroless plating. When doing so, by forming a mask (resist) in advance in parts of the circuit patterns 12a to 12h where the first protective films and the second protective films are not to be formed and removing the resist after electroless plating, it is possible to form the first protective films and the second protective films on the circuit patterns 12a to 12h.

As described above in the first embodiment, the first protective films formed on the facing side surfaces of the circuit patterns 12a to 12h make it possible to prevent the production of corrosion products on the side surfaces.

However, with only the first protective films, it is not possible to prevent the production of corrosion products at edge portions along the first protective films of the respective front surfaces of adjacent circuit patterns. In particular, when the distance between adjacent circuit patterns is short and large electric fields are applied between adjacent circuit patterns, corrosion products are produced at the edge portions of the front surfaces of adjacent circuit patterns. This may result in the risk of adjacent circuit patterns becoming electrically connected.

For this reason, in the second embodiment, in addition to the first protective films formed on the side portions of the circuit patterns, the second protective films are formed on edge portions of the front surfaces of the circuit patterns along the first protective films. By doing so, the production of corrosion products due to ion migration on facing side surfaces and the edge portions of the front surfaces of adjacent circuit patterns out of the circuit patterns 12a to 12h is suppressed. This means that it is possible to reliably avoid short circuits between adjacent circuit patterns.

In this way, with the semiconductor device 10a, the plurality of circuit patterns 12a to 12h have the plurality of first protective films formed on side surfaces that face adjacent circuit patterns and the second protective films formed along the first protective films on edge portions of the front surfaces of the circuit patterns 12a to 12h. Parts of the plurality of circuit patterns 12a to 12h aside from the side surfaces and the edge portions mentioned above are not subjected to a plating process or the like.

For this reason, when the semiconductor elements 15a, 15b, and 15d, the electronic component 15c, and the contact elements 16a to 16g are directly bonded via the solder 18a to 18i onto the bonding regions 15a1, 15b1, 15d1, 15c1, 15c2, and 16a1 to 16g1 of the plurality of circuit patterns 12a to 12h, a drop-in wettability of the plurality of circuit patterns 12a to 12h for the solder 18a to 18i is avoided. Accordingly, a drop in the bonding strength of the semiconductor elements 15a, 15b, and 15d, the electronic component 15c, and the contact elements 16a to 16g on the plurality of circuit patterns 12a to 12h is avoided.

In addition, since the plurality of circuit patterns 12a to 12h have the plurality of first protective films (reference numerals omitted) formed on the side surfaces of adjacent circuit patterns and the second protective films formed along the first protective films on the edge portions of the front surfaces of the circuit patterns, the production of corrosion products due to ion migration on the facing side surfaces of adjacent circuit patterns is avoided. By doing so, it is possible to reliably avoid short circuits between the adjacent circuit patterns.

Accordingly, there is a reduction in malfunctions of the semiconductor device 10a, which improves reliability.

Third Embodiment

In the semiconductor device 10a according to the second embodiment, the first protective films and the second protective films are formed to suppress the production of corrosion products due to ion migration on facing side surfaces and edge portions of front surfaces along these side surfaces of adjacent circuit patterns, out of the circuit patterns 12a to 12h.

A semiconductor device 10b that is capable of more reliably suppressing the production of corrosion products between the circuit patterns 12a to 12h due to ion migration will now be described with reference to FIGS. 7 to 9.

Figure 7:
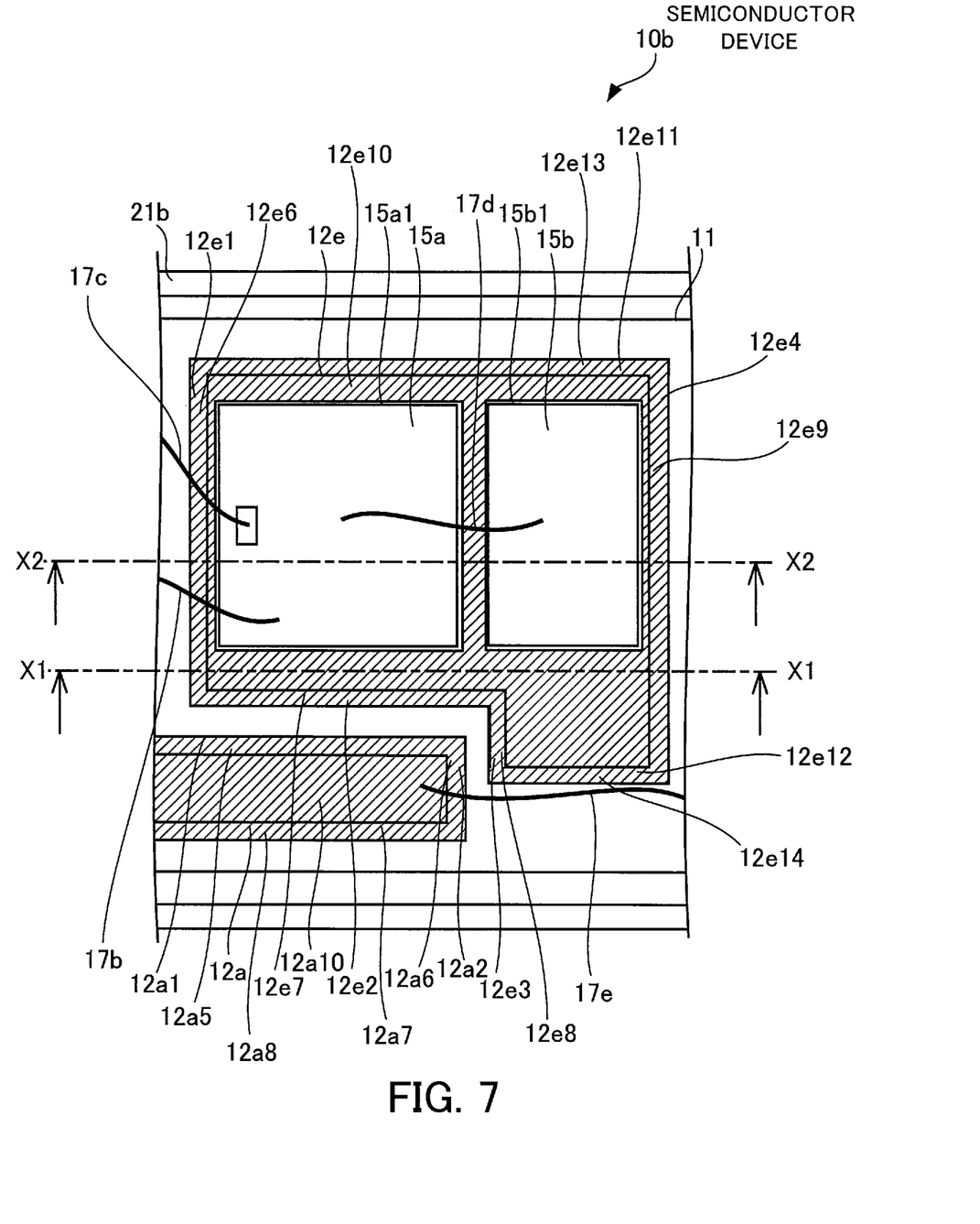
FIG. 7 is a plan view of a principal part of a semiconductor device according to a third embodiment.

FIG. 7 is a plan view of a principal part of a semiconductor device according to a third embodiment. FIGS. 8 and 9 are cross-sectional views of principal parts of the semiconductor device according to the third embodiment.

Figure 9:
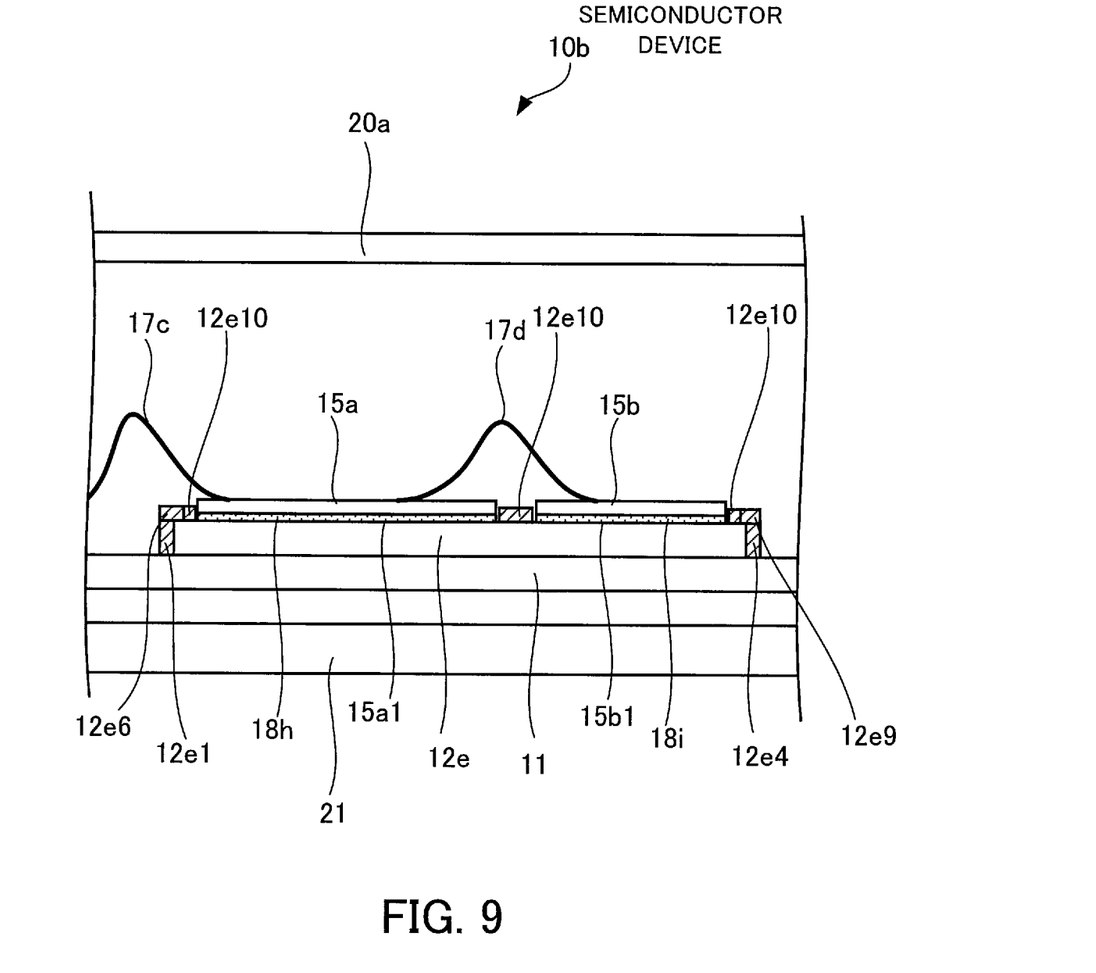
FIG. 9 is a second cross-sectional view of a principal part of the semiconductor device according to the third embodiment.

Note that in the semiconductor device 10b depicted in FIGS. 7 and 9, parts with the same reference numerals as the semiconductor device 10 according to the first embodiment (depicted in FIGS. 1 to 3) indicate the same configurations.

In the same way as in the second embodiment, FIG. 7 corresponds to a plan view of the periphery of the circuit pattern 12e in the first embodiment depicted in FIG. 1. FIG. 8 is a cross-sectional view along a dot-dash line X1-X1 in FIG. 7 and FIG. 9 is a cross-sectional view along a dot-dash line X2-X2 in FIG. 7.

In the same way as the semiconductor device 10, the semiconductor device 10b has first protective films formed on facing side surfaces of the plurality of circuit patterns 12a to 12h. In addition, in the semiconductor device 10b, the first protective films are formed on side surfaces aside from the facing side surfaces of the plurality of circuit patterns 12a to 12h. In the semiconductor device 10b, second protective films are formed on edge portions of the front surfaces of the circuit patterns 12a to 12h along the first protective films formed on the side surfaces of the circuit patterns 12a to 12h. In the semiconductor device 10b, second protective films are also formed on edge portions of the front surfaces of the circuit patterns 12a to 12h along the first protective films formed on side surfaces aside from the facing side surfaces of the plurality of circuit patterns 12a to 12h. In the semiconductor device 10b, third protective films are formed on the front surfaces of the circuit patterns 12a to 12h so as to expose the bonding regions 15a1, 15b1, 15d1, 15c1, 15c2, and 16a1 to 16g1 of the circuit patterns 12a to 12h.

In other words, the first protective films, the second protective films, and the third protective films cover all of the plurality of circuit patterns 12a to 12h of the semiconductor device 10b while exposing the bonding regions 15a1, 15b1, 15d1, 15c1, 15c2, and 16a1 to 16g1 on the front surfaces of the circuit patterns 12a to 12h.

Figure 8:
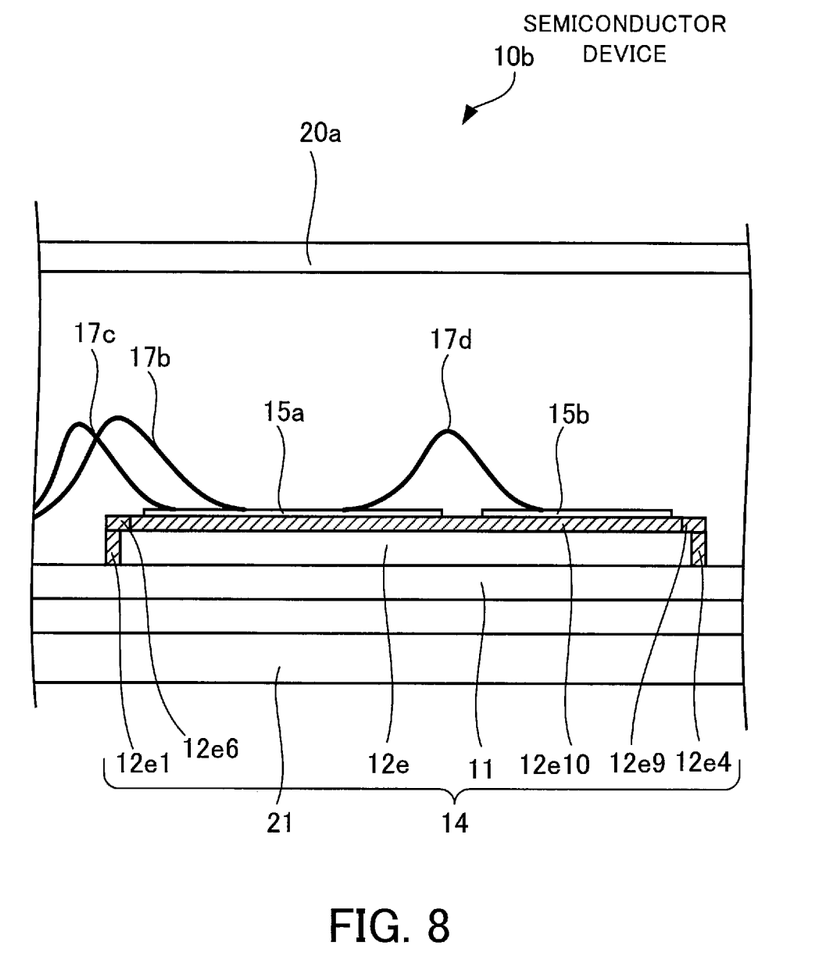
FIG. 8 is a first cross-sectional view of a principal part of the semiconductor device according to the third embodiment.

For example, as depicted in FIGS. 7 to 9, in the same way as in the second embodiment, the circuit pattern 12e has first protective films 12e1 to 12e4 formed on the side surfaces that face the circuit patterns 12a to 12d and 12f to 12h (see FIG. 1). In addition, first protective films 12e11 and 12e12 are formed on the remaining side surfaces of the circuit pattern 12a. Second protective films 12e6 to 12e9 are formed on edge portions of the front surface of the circuit pattern 12e along the first protective films 12e1 to 12e4. In addition, the circuit pattern 12e has second protective films 12e13 and 12e14 formed on edge portions of the front surface of the circuit pattern 12e along the first protective films 12e11 and 12e12.

In addition, the circuit pattern 12e has the third protective film 12e10 formed on the front surface so as to expose the bonding regions 15a1 and 15b1.

As depicted in FIG. 7, the circuit pattern 12a has the first protective films 12a1 and 12a2 formed on side surfaces that face the circuit patterns 12b and 12e (see FIG. 1) and the second protective films 12a5 and 12a6 formed on edge portions of the front surface of the circuit pattern 12a along the first protective films 12a1 and 12a2.

The circuit pattern 12a also has a first protective film 12a7 formed on the remaining side surface and the second protective film 12a8 formed on the edge portion of the front surface of the circuit pattern 12a along the first protective film 12a7. However, on the circuit pattern 12a of the semiconductor device 10b, the first protective film 12a2 and the second protective film 12a6 are formed so as to extend along the edge of the circuit pattern 12a unlike the semiconductor device 10a.

In addition, the circuit pattern 12a has a third protective film 12a10 formed on the front surface of the circuit pattern 12a so as to expose the bonding region 16a1 (see FIG. 1, but omitted in FIG. 7). Note that when no specific distinction is made between the third protective films, the reference numerals 12a10 and 12e10 may be omitted.

Although omitted from the drawings, in the same way as the circuit patterns 12a and 12e, the circuit patterns 12b to 12d and 12f to 12h have the first protective films and the second protective films formed on all of the side surfaces around the circumference and edge portions of the front surfaces along these side surfaces, and also have third protective films (not illustrated) formed on the front surfaces of the circuit patterns 12b to 12d and 12f to 12h so as to expose the first protective films 12b1, 12c2, 12d1, 12f1, 12g1 and 12h1, and the bonding surfaces 16a1 to 16g1.

Note that in the same way as the first protective films and the second protective films, the third protective films use a material with superior resistance to corrosion. In the same way as the first protective films, example materials include aluminum, nickel, titanium, chromium, molybdenum, tantalum, niobium, tungsten, vanadium, bismuth, zirconium, hafnium, gold, platinum, palladium, and alloys that include at least one of these metals.

In the same way as the first and second protective films in the first and second embodiments, it is possible to form the third protective films by electroless plating. When doing so, by forming a mask (resist) in advance in the bonding regions 15a1, 15b1, 15d1, 15c1, 15c2, and 16a1 to 16g1 of the circuit patterns 12a to 12h and removing the resist after electroless plating, it is possible to form the first protective films, the second protective films, and the third protective films on the circuit patterns 12a to 12h. Accordingly, the first protective films, the second protective films, and the third protective films are integrally formed. In other words, to form the first protective films, the second protective films, and the third protective films on the plurality of circuit patterns 12a to 12h of the semiconductor device 10b, it is sufficient to mask (i.e., provide a resist on) the bonding regions 15a1, 15b1, 15d1, 15c1, 15c2, and 16a1 to 16g1. This means that compared to the first and second embodiments, it is easy to form the first protective films, the second protective films, and the third protective films.

In the semiconductor device 10b described above, the plurality of circuit patterns 12a to 12h have the plurality of first protective films formed on the side surfaces around the circumferences of the circuit patterns and the second protective films formed along the first protective films on edge portions of the front surfaces of the circuit patterns 12a to 12h. In addition, the plurality of circuit patterns 12a to 12h have the third protective films formed on the front surfaces so as to expose the bonding regions 15a1, 15b1, 15d1, 15c1, 15c2, and 16a1 to 16g1.

This means that when the semiconductor elements 15a, 15b, and 15d, the electronic component 15c, and the contact elements 16a to 16g are directly bonded via the solder 18a to 18i to the bonding regions 15a1, 15b1, 15d1, 15c1, 15c2, and 16a1 to 16g1 of the plurality of circuit patterns 12a to 12h, a drop-in wettability of the plurality of circuit patterns 12a to 12h for the solder 18a to 18i is avoided. Accordingly, a drop in the bonding strength of the semiconductor elements 15a, 15b, and 15d, the electronic component 15c, and the contact elements 16a to 16g on the plurality of circuit patterns 12e to 12h is avoided.

In addition, the plurality of circuit patterns 12a to 12h have a plurality of first protective films formed on the side surfaces around the circumferences of the circuit patterns, second protective films formed along the first protective films on edge portions of the front surfaces of the circuit patterns, and the third protective films formed so as to expose bonding regions on the front surfaces of the circuit patterns. This means that production of corrosion products between the circuit patterns due to ion migration is reliably suppressed. By doing so, it is possible to reliably prevent short circuits between the circuit patterns.

Accordingly, there is a reduction in malfunctions of the semiconductor device 10b, which improves reliability.

Note that when considering how the first protective films, the second protective films, and the third protective films are formed in the semiconductor device 10b according to the third embodiment, so long as the bonding regions 15a1, 15b1, 15d1, 15c1, 15c2, and 16a1 to 16g1 of the plurality of circuit patterns 12a to 12h are exposed in the semiconductor device 10, it is sufficient to form a plurality of first protective films on at least facing side surfaces of adjacent circuit patterns out of the plurality of circuit patterns 12a to 12h.

In the same way, so long as the bonding regions 15a1, 15b1, 15d1, 15c1, 15c2, and 16a1 to 16g1 of the plurality of circuit patterns 12a to 12h in the semiconductor device 10b are exposed, it is sufficient to form the plurality of first protective films to be formed on facing side surfaces of the circuit patterns and to form the second protective films along the first protective films on edge portions of the front surfaces of the circuit patterns 12a to 12h.

According to the present embodiments, it is possible to avoid a drop in bonding strength of components on circuit patterns and avoid a drop in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a substrate including an insulating plate having a front surface and a plurality of circuit patterns that are formed on the front surface of the insulating plate, that have respective front surfaces, that have respective side surfaces, and that have respective edge portions on the front surfaces of the plurality of circuit patterns along the respective side surfaces;
a plurality of plated protective films formed of a metal or an alloy to substantially completely cover the respective side surfaces of the plurality of circuit patterns while exposing bonding regions on the respective front surfaces of the plurality of circuit patterns which are unplated bonding regions; and
a plurality of components bonded via solder onto the unplated bonding regions of the plurality of circuit patterns, wherein the plurality of plated protective films includes first protective films which substantially completely cover the respective side surfaces of the plurality of circuit patterns; and second protective films formed on respective edge portions of the front surfaces of the plurality of circuit patterns along the side surfaces.

2. The semiconductor device according to claim 1, wherein the plurality of plated protective films further includes third protective films that are formed on the respective front surfaces of the plurality of circuit patterns so as to expose the bonding regions.

3. The semiconductor device according to claim 1, wherein the plurality of components includes at least one semiconductor element, at least one contact element, or both at least one semiconductor element and at least one contact element.

4. The semiconductor device according to claim 1, wherein the plurality of circuit patterns is formed of copper or copper alloy.

5. The semiconductor device according to claim 1, wherein the plurality of plated protective films includes a plurality of first protective films which substantially completely cover the respective side surfaces of the plurality of circuit patterns and are formed of nickel or nickel alloy.

6. The semiconductor device according to claim 1, wherein the solder is lead-free solder that includes at least one alloy selected from the group consisting of a tin-silver-copper alloy, a tin-zinc-bismuth alloy, a tin-copper alloy, and a tin-silver-indium-bismuth alloy as a main component.

7. The semiconductor device according to claim 6, wherein nickel, germanium, cobalt or silicon is added to the solder.

8. The semiconductor device according to claim 1, wherein the second protective films on the edge portions of the front surfaces of the plurality of circuit patterns extend to prescribed positions between side portions of the front surfaces of the plurality of circuit patterns and the unplated bonding regions.

9. The semiconductor device according to claim 1, wherein all of the side surfaces that face another side surface have respective plated protective films.

10. A semiconductor device, comprising:
a substrate including an insulating plate having a front surface and a plurality of circuit patterns that are formed on the front surface of the insulating plate, that have respective front surfaces, that have respective side surfaces, and that have respective edge portions on the front surfaces of the plurality of circuit patterns along the respective side surfaces;
a plurality of plated protective films formed of a metal or an alloy to substantially completely cover the respective side surfaces of the plurality of circuit patterns while exposing bonding regions on the respective front surfaces of the plurality of circuit patterns which are unplated bonding regions; and
a plurality of components bonded via solder onto the unplated bonding regions of the plurality of circuit patterns,
wherein at least one of the plurality of components is bonded so as to span between adjacent circuit patterns among the plurality of circuit patterns.

11. The semiconductor device according to claim 10, wherein the plurality of components includes at least one semiconductor element, at least one contact element, or both at least one semiconductor element and at least one contact element.

12. The semiconductor device according to claim 10, wherein the plurality of components includes electronic components.

13. The semiconductor device according to claim 10, wherein the plurality of circuit patterns is formed of copper or copper alloy.

14. The semiconductor device according to claim 10, wherein the plurality of plated protective films includes a plurality of first protective films which substantially completely cover the respective side surfaces of the plurality of circuit patterns and are formed of nickel or nickel alloy.

15. The semiconductor device according to claim 10, wherein the solder is lead-free solder that includes at least one alloy selected from the group consisting of a tin-silver-copper alloy, a tin-zinc-bismuth alloy, a tin-copper alloy, and a tin-silver-indium-bismuth alloy as a main component.

16. The semiconductor device according to claim 15, wherein nickel, germanium, cobalt or silicon is added to the solder.

17. The semiconductor device according to claim 10, wherein all of the side surfaces that face another side surface have respective plated protective films.

18. A semiconductor device, comprising:
a substrate including an insulating plate having a front surface and a plurality of circuit patterns that are formed on the front surface of the insulating plate, that have respective front surfaces, that have respective side surfaces, and that have respective edge portions on the front surfaces of the plurality of circuit patterns along the respective side surfaces, wherein side surfaces that do not face another side surface among the side surfaces of the circuit patterns are exposed;
a plurality of plated protective films formed of a metal or an alloy to substantially completely cover the respective side surfaces of the plurality of circuit patterns while exposing bonding regions on the respective front surfaces of the plurality of circuit patterns which are unplated bonding regions; and
a plurality of components bonded via solder onto the unplated bonding regions of the plurality of circuit patterns.

* * * * *